United States Patent
Song et al.

(10) Patent No.: US 8,917,145 B2
(45) Date of Patent: Dec. 23, 2014

(54) AMPLIFIER CIRCUIT AND OPERATING METHOD THEREOF

(75) Inventors: Young Jean Song, Gyunggi-do (KR); Jun Goo Won, Gyunggi-do (KR); Youn Suk Kim, Gyunggi-do (KR); Shinichi Iizuka, Gyunggi-do (KR); Ju Young Park, Gyunggi-do (KR); Ki Joong Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/452,605

(22) Filed: Apr. 20, 2012

(65) Prior Publication Data

US 2013/0207728 A1    Aug. 15, 2013

(30) Foreign Application Priority Data

Feb. 9, 2012   (KR) ................. 10-2012-0013141

(51) Int. Cl.
*H03F 3/191* (2006.01)
(52) U.S. Cl.
USPC ........................................ 330/302; 330/295
(58) Field of Classification Search
USPC .............................. 330/124 R, 277, 295, 302
See application file for complete search history.

(56) References Cited

U.S. PATENT DOCUMENTS

| | | | |
|---|---|---|---|
| 6,678,513 B2 | 1/2004 | Glasbrener et al. | |
| 6,768,381 B2 * | 7/2004 | Kuriyama | 330/302 |
| 6,970,040 B1 | 11/2005 | Dening | |
| 7,345,547 B2 | 3/2008 | Wang et al. | |
| 7,449,957 B2 * | 11/2008 | Enomoto et al. | 330/295 |
| 7,834,700 B2 * | 11/2010 | Inamori et al. | 330/295 |
| 8,130,041 B2 * | 3/2012 | Kim et al. | 330/295 |
| 2002/0097096 A1 | 7/2002 | Brandt | |
| 2004/0251966 A1 | 12/2004 | Yeh | |

FOREIGN PATENT DOCUMENTS

| | | |
|---|---|---|
| KR | 10-2007-0015190 | 2/2007 |
| KR | 10-2009-0058555 | 6/2009 |
| WO | WO 2005/119903 A1 | 12/2005 |
| WO | WO 2008/030303 A2 | 3/2008 |

OTHER PUBLICATIONS

Korean Office Action with English translation issued in Korean Application No. 10-2012-0013141 dated Jun. 10, 2013.

* cited by examiner

*Primary Examiner* — Khanh V Nguyen
(74) *Attorney, Agent, or Firm* — McDermott Will & Emery LLP

(57) ABSTRACT

There is provided an amplifier circuit. The amplifier circuit includes an amplifying unit including at least one transistor; at least one first bias circuit unit including a resistor and connected to the at least one transistor; and at least one second bias circuit unit connected between an input terminal to which an input signal is applied and the at least one transistor so as to block an input signal having a frequency higher than a first frequency or having a frequency lower than a second frequency. The amplifier circuit according to embodiment of the present invention may prevent thermal runaway, remove a harmonic component from an input signal to be amplified and suppress oscillations.

16 Claims, 4 Drawing Sheets

AMPLIFIER CIRCUIT AND OPERATING METHOD THEREOF

CROSS-REFERENCE TO RELATED APPLICATIONS

This application claims the priority of Korean Patent Application No. 10-2012-0013141 filed on Feb. 9, 2012, in the Korean Intellectual Property Office, the disclosure of which is incorporated herein by reference.

BACKGROUND OF THE INVENTION

1. Field of the Invention

The present invention relates to an amplifier circuit including a transistor, and more particularly, to an amplifier circuit capable of preventing thermal runaway and optimizing response characteristics in a frequency band to suppress oscillations and remove harmonic components.

2. Description of the Related Art

An amplifier circuit, a circuit amplifying an input signal to generate an output signal, is widely used in electronic device power supply systems as well as in amplifying a communication signal of a wireless communication device. An amplifier circuit may include a bias circuit applying a bias signal for operating the amplifier circuit in a voltage or current form, in addition to an amplifier circuit amplifying an input signal to generate an output signal.

An amplifier circuit generally includes a plurality of elements such as an operational amplifier, a transistor, a resistor, and the like, and receives power required for driving from battery voltage, power supply voltage, or the like, input to the electronic device. In this case, in consideration of the characteristics of an electrical element, heat may be generated in the amplifier element during signal amplification. In the case in which the generated heat is not efficiently controlled, a thermal runaway phenomenon may occur, deteriorating the performance of, or even destroying, the amplifier element.

The thermal runaway phenomenon may be a serious problem, particularly in an amplifier circuit including a plurality of transistors. When a temperature of a transistor operating as a signal amplifier element within the amplifier circuit increases, a beta ($\beta$) value corresponding to a ratio between a collector current and a base current of the transistor decreases, and a larger base current is generally required in order to maintain current in a collector terminal connected to an output terminal. Therefore, in order to apply the larger base current thereto, voltage may be increased, whereby the thermal runaway phenomenon may occur.

In the following related art document, Patent Document 1 discloses an amplifier circuit including a plurality of transistors. The amplifying circuit includes a resistor connected between a direct current (DC) bias signal input terminal and a base terminal of the transistor in order to prevent a thermal runaway phenomenon. However, since only a capacitor and a resistor are connected to a signal input terminal RF_IN through which a wireless signal to be amplified is input, and the base terminal of the plurality of transistors, an effect of suppressing oscillations or transmitting only a signal having a specific frequency band may not be expected.

RELATED ART DOCUMENT (Patent Document 1) U.S. Pat. No. 6,678,513 B2

SUMMARY OF THE INVENTION

An aspect of the present invention provides an amplifier circuit capable of preventing thermal runaway in a transistor, an amplifier element, by disposing a resistor in a direct current (DC) bias signal transfer path of the amplifier circuit and capable of suppressing oscillations therein and removing harmonic components therefrom by disposing an inductive element and a capacitive element in series in a transfer path of an input signal to be amplified.

According to an aspect of the present invention, there is provided an amplifier circuit including: an amplifying unit including at least one transistor; at least one first bias circuit unit including a resistor and connected to the at least one transistor; and at least one second bias circuit unit connected between an input terminal to which an input signal is applied and the at least one transistor so as to block an input signal having a frequency higher than a first frequency or having a frequency lower than a second frequency.

The at least one first bias circuit unit and the at least one second bias circuit unit may be connected to a base or gate terminal of the at least one transistor.

The at least one second bias circuit unit may include a capacitive element and an inductive element connected in series.

The resistor included in the at least one first bias circuit unit may be connected between the inductive element included in the at least one second bias circuit unit and a base or gate terminal of the at least one transistor.

The resistor included in the at least one first bias circuit unit may be connected between the inductive element and the capacitive element included in the at least one second bias circuit unit.

The amplifier circuit may further include a resistor connected between the input terminal and the at least one second bias circuit unit.

The at least one transistor may have a collector terminal connected to an output terminal outputting an output signal.

The first frequency may be higher than the second frequency.

According to another aspect of the present invention, there is provided an amplifier circuit including: a plurality of transistors; a plurality of resistors, each disposed on a path along which a bias signal inputted through a direct current (DC) bias signal input terminal is transmitted to a base or gate terminal of each of the plurality of transistors; and a plurality of inductive elements and a plurality of capacitive elements each connected between the base or gate terminal of each of the plurality of transistors and a radio frequency (RF) signal input terminal, wherein the plurality of inductive elements and the plurality of the capacitive elements are respectively connected in series.

Each of the plurality of transistors may have a collector or drain terminal connected to an RF signal output terminal.

Each of the plurality of resistors may be connected between the DC bias signal input terminal and the base or gate terminal of each of the plurality of transistors.

Each of the plurality of resistors may be connected between the DC bias signal input terminal and respective nodes between the plurality of inductive elements and the plurality of capacitive elements connected in series.

According to another aspect of the present invention, there is provided a method of operating an amplifier circuit, the method including: receiving a first signal through a first bias circuit unit including a resistor; receiving a second signal through a second bias circuit unit blocking a signal having a frequency higher than a first frequency or having a frequency lower than a second frequency; and operating the amplifier circuit by the first signal to amplify the second signal.

The receiving of the first signal may include receiving a DC bias signal transmitted through the first bias circuit unit as the first signal.

The receiving of the second signal may include receiving an RF signal transmitted through the second bias circuit unit as the second signal.

The first signal and the second signal may be received through a base or gate terminal of a transistor operating as an amplifier.

The receiving of the second signal may be performed through the second bias circuit unit including a capacitive element and an inductive element connected in series.

The first frequency may be higher than the second frequency.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
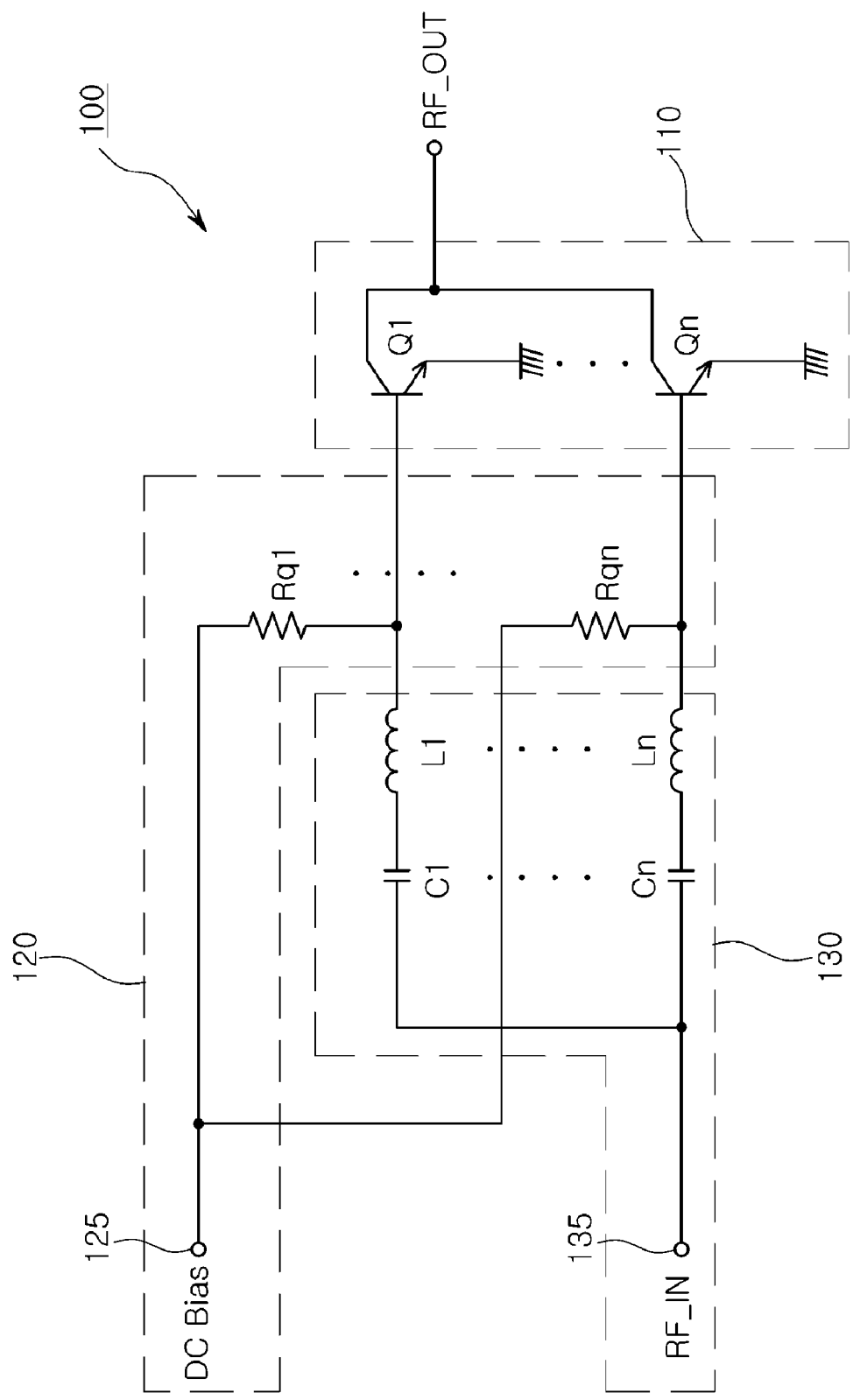
FIG. 1 is a view showing an amplifier circuit according to an embodiment of the present invention.

Embodiments of the present invention will be described in detail with reference to the accompanying drawings. These embodiments will be described in detail in order to allow those skilled in the art to practice the present invention. It should be appreciated that various embodiments of the present invention are different but are not necessarily exclusive. For example, specific shapes, configurations, and characteristics described in an embodiment of the present invention may be implemented in another embodiment without departing from the spirit and scope of the present invention. In addition, it should be understood that the positions and arrangements of individual components in each embodiment may be changed without departing from the spirit and scope of the present invention. Therefore, the detailed description provided below should not be construed as being restrictive. In addition, the scope of the present invention is defined only by the accompanying claims and their equivalents if appropriate. Similar reference numerals will be used throughout to describe the same or like components Hereinafter, embodiments of the present invention will be described in detail with reference to the accompanying drawings so that those skilled in the art may easily practice the present invention.

FIG. 1 is a view showing an amplifier circuit according to an embodiment of the present invention.

Referring to FIG. 1, an amplifier circuit 100 according to an embodiment of the present invention may include an amplifying unit 110 having a plurality of transistors Q1 to Qn, a first bias circuit unit 120 applying a direct current (DC) bias signal to base terminals of the plurality of transistors Q1 to Qn, and a second bias circuit unit 130 applying a signal to be amplified to the plurality of transistors Q1 to Qn. Hereinafter, for convenience of explanation, it is assumed in the present embodiment that the plurality of transistors operating as the amplifying unit 110 are bipolar junction transistors (BJTs). However, the amplifying unit 110 is not limited thereto and may be designed using different types of transistors from BJTs, for example, a field effect transistor (FET). Collector terminals of the plurality of transistors Q1 to Qn may be connected to a signal output terminal RF_OUT, and emitter terminals of the plurality of transistors Q1 to Qn may be connected to a ground terminal.

The first bias circuit unit 120 may include a DC bias signal terminal 125 to which the DC bias signal is applied, and a plurality of resistors Rq1 to Rqn. The plurality of resistors Rq1 to Rqn may be disposed on a path along which the DC bias signal is transmitted. In the present embodiment, the plurality of resistors Rq1 to Rqn may be connected between the DC bias signal terminal 125 and the base terminals of the plurality of transistors Q1 to Qn. The plurality of resistors Rq1 to Rqn may prevent thermal runaway of the plurality of transistors Q1 to Qn that may occur during an amplifying operation, which will be described below.

The second bias circuit unit 130 may include a signal input terminal RF_IN 135 to which the signal to be amplified is applied, capacitive elements C1 to Cn, and inductive elements L1 to Ln. In the present embodiment, it is assumed that a radio frequency (RF) signal to be amplified is applied to the signal input terminal (RF_IN) 135; however, the present invention is not limited thereto. Each of the capacitive elements C1 to Cn included in the second bias circuit unit 130 may be a capacitor, and each of the inductive elements L1 to Ln included therein may be an inductor or a conductive wire having a predetermined length. The capacitive elements C1 to Cn and the inductive elements L1 to Ln included in the second bias circuit unit 130 may be respectively provided in the plurality of transistors Q1 to Qn and be connected in series.

Hereinafter, a specific operation of the amplifier circuit shown in FIG. 1 will be described.

The amplifying unit 110 including the plurality of transistors Q1 to Qn may receive a bias signal necessary for an operation thereof through the plurality of resistors Rq1 to Rqn. As shown in FIG. 1, the plurality of transistors Q1 to Qn and the plurality of resistors Rq1 to Rqn may correspond to each other in a one-to-one scheme. As described above, the plurality of resistors Rq1 to Rqn may prevent the thermal runaway of the plurality of transistors Q1 to Qn that may occur during the amplifying operation.

Heat may be generated during the amplifying operation in which the plurality of transistors Q1 to Qn amplify an input signal, and the generated heat may decrease beta ($\beta$) values in each of the plurality of transistors Q1 to Qn. Since the beta ($\beta$) values of the transistors Q1 to Qn are defined by a ratio of collector current to base current, as the beta ($\beta$) value decreases, a larger base current is required in order to maintain the collector current connected to the output terminal RF_OUT. An increase in the base current leads to an increase in a magnitude of voltage applied to the plurality of resistors Rq1 to Rqn respectively connected to the base terminals of the plurality of transistors Q1 to Qn, such that base-emitter voltage ($V_{BE}$) of the plurality of transistors Q1 to Qn decreases. As the base-emitter voltage ($V_{BE}$) decreases, the collector current decreases, and thus, the thermal runaway of each of the plurality of transistors Q1 to Qn may be prevented through the above-described operation. That is, each of the plurality of resistors Rq1 to Rqn may be operated as a negative feedback circuit.

The capacitive elements C1 to Cn and the inductive elements L1 to Ln connected in series between the signal input terminal (RF_IN) 135 to which the signal to be amplified is inputted and the base terminals of the transistors Q1 to Qn may suppress oscillations to increase system stability. The capacitive elements C1 to Cn may be operated as a high pass filter (HPF) allowing a high frequency band signal to pass therethrough, and the inductive elements L1 to Ln may be operated as a low pass filter (LPF) allowing a low frequency band signal to pass therethrough. Therefore, the capacitive elements C1 to Cn and the inductive elements L1 to Ln are connected in series and values thereof are appropriately selected, such that harmonic components are decreased and other high frequency components returned by feedback are blocked, whereby oscillations may be blocked.

The capacitive elements C1 to Cn and the inductive elements L1 to Ln may be operated as a band pass filter (BPF) allowing only a specific frequency band signal to pass therethrough by series resonance. An RF input signal having a frequency lower than that of a first frequency is blocked according to values of the capacitive elements C1 to Cn, and an RF input signal having a frequency higher than that of a second frequency is blocked according to values of the inductive elements L1 to Ln. Therefore, the values of the capacitive elements C1 to Cn and the inductive elements L1 to Ln are appropriately selected to thereby realize an amplifier circuit amplifying only an RF input signal having a desired frequency band.

Figure 2:
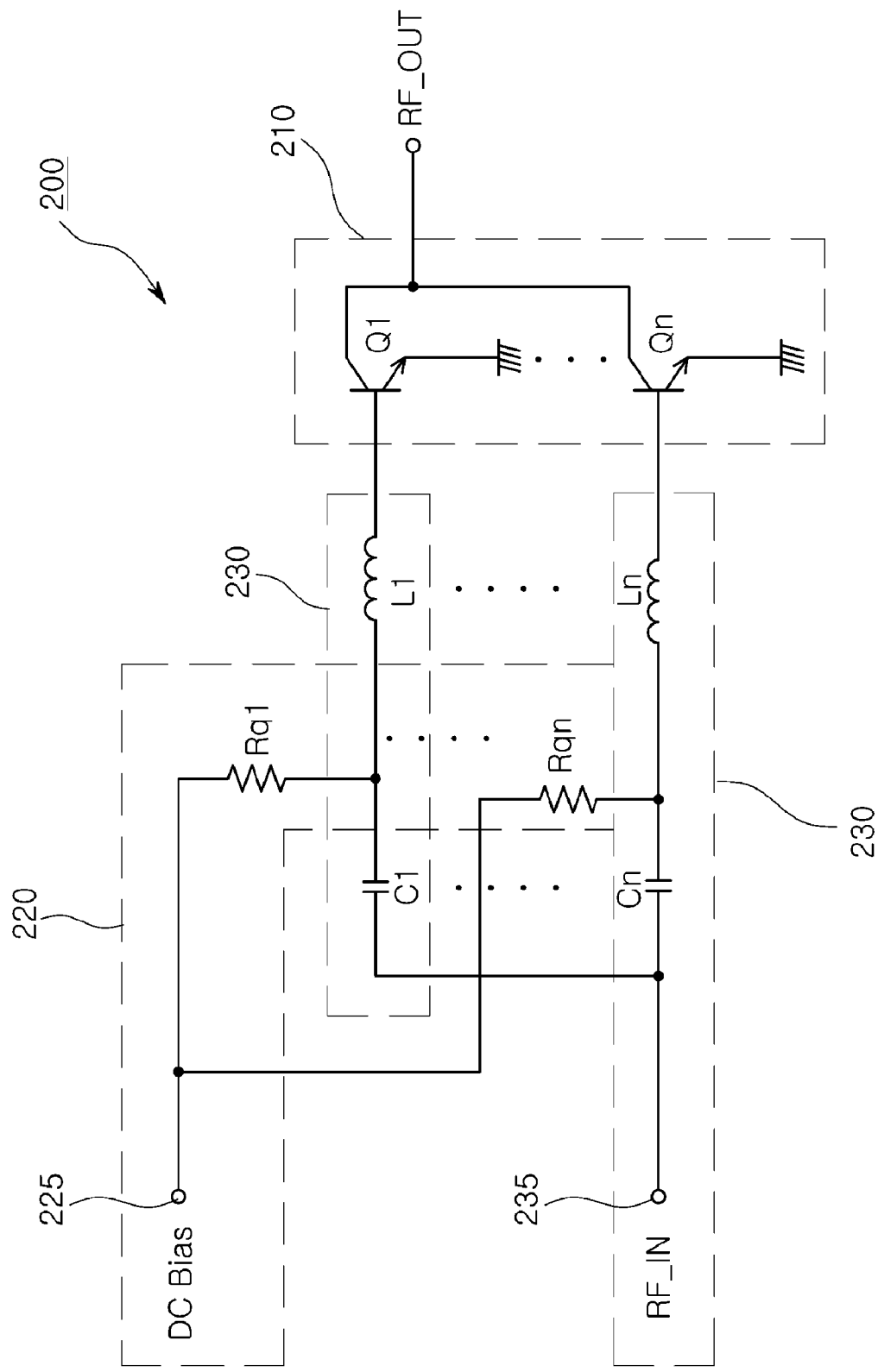
FIG. 2 is a view showing an amplifier circuit according to another embodiment of the present invention.

FIG. 2 is a view showing an amplifier circuit according to another embodiment of the present invention.

An amplifier circuit 200 of FIG. 2 may include an amplifying unit 210 including a plurality of transistors Q1 to Qn, a first bias circuit unit 220 including a plurality of resistors Rq1 to Rqn and a DC bias signal input terminal (DC bias) 225, and a second bias circuit unit 230 including capacitive elements C1 to Cn and inductive elements L1 to Ln connected in series and a signal input element (RF_IN) 235, similar to the amplifier circuit 100 shown in FIG. 1.

Unlike the amplifier circuit 100 of FIG. 1, in the amplifier circuit 200 of FIG. 2, the plurality of resistors Rq1 to Rqn included in the first bias circuit unit 220 may be respectively connected to base terminals of the plurality of transistors Q1 to Qn through the plurality of inductive elements L1 to Ln included in the second bias circuit unit 230. A DC bias signal input through the DC bias signal input terminal (DC Bias) 225 may be applied to the base terminals of the transistors Q1 to Qn through the inductive elements L1 to Ln, similar to an RF input signal. Therefore, a high frequency signal introduced through the DC bias signal input terminal DC Bias, 225 is also blocked by the inductive elements L1 to Ln, whereby overall system stability may be increased.

Figure 3:
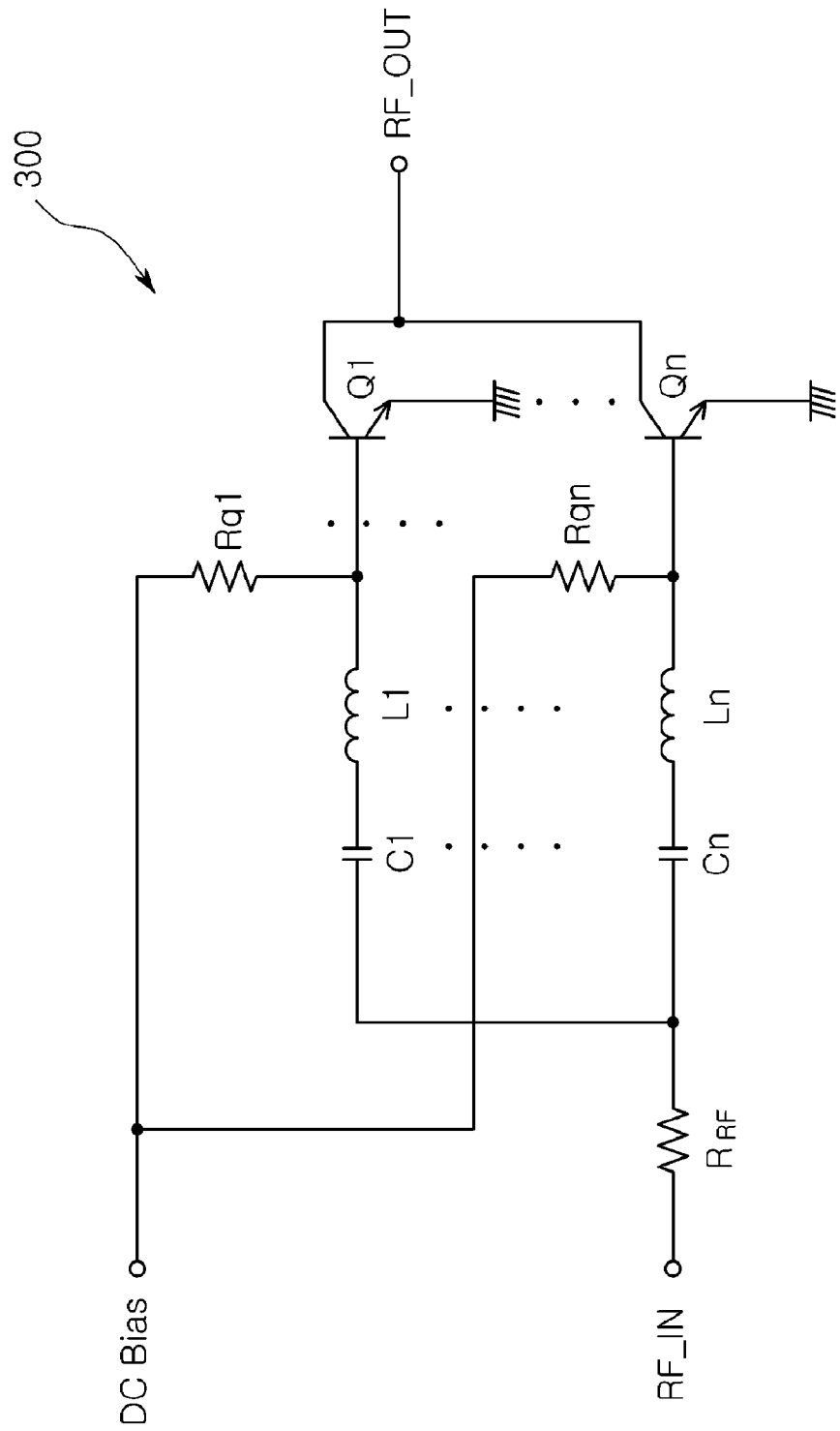
FIG. 3 is a view showing an amplifier circuit according to another embodiment of the present invention.

FIG. 3 is a view showing an amplifier circuit according to another embodiment of the present invention.

Referring to FIG. 3, an amplifier circuit 300 according to the present embodiment may include a plurality of transistors Q1 to Qn amplifying an RF input signal, a plurality of resistors Rq1 to Rqn having a first node connected to base terminals of the plurality of transistors Q1 to Qn and a second node connected to a DC bias signal input terminal (DC Bias), and inductive elements L1 to Ln and capacitive elements C1 to Cn connected in series and connected to a path between an input signal terminal RF_IN and the base terminals of the transistors Q1 to Qn, the path along which the RF input signal is transmitted. In addition, as shown in FIG. 3, a resistor $R_{RF}$ may be additionally connected between the input signal terminal RF_IN and the capacitive elements C1 to Cn.

The plurality of resistors Rq1 to Rqn disposed on a path along which a DC bias signal is transmitted, and the inductive elements L1 to Ln and the capacitive elements C1 to Cn connected to the path along which the RF input signal is transmitted may perform the same function as those of the amplifier circuits 100 and 200 shown in FIGS. 1 and 2. That is, the plurality of resistors Rq1 to Rqn may serve to prevent the thermal runaway phenomenon that may occur due to overheating of the transistors Q1 to Qn during the amplifying operation. In addition, the inductive elements L1 to Ln and the capacitive elements C1 to Cn may remove the harmonic components of the RF input signal and suppress oscillations therein.

The resistor $R_{RF}$ additionally disposed on the path along which the RF input signal is transmitted may serve to maintain the linearity of the transistors Q1 to Qn operating as amplifiers as well as the stability of the system. In the case in which an excessively large RF input signal is applied through the signal input terminal RF_IN, the DC bias signal may become unstable due to the RF input signal, such that non-linearity of the transistors Q1 to Qn may be increased. The resistor $R_{RF}$ having a suitable magnitude is connected to the path along which the RF input signal is transmitted, such that in the case in which the excessively large RF input signal is applied, the resistor $R_{RF}$ serves to decrease the RF input signal, whereby deterioration of linearity may be prevented.

Figure 4:
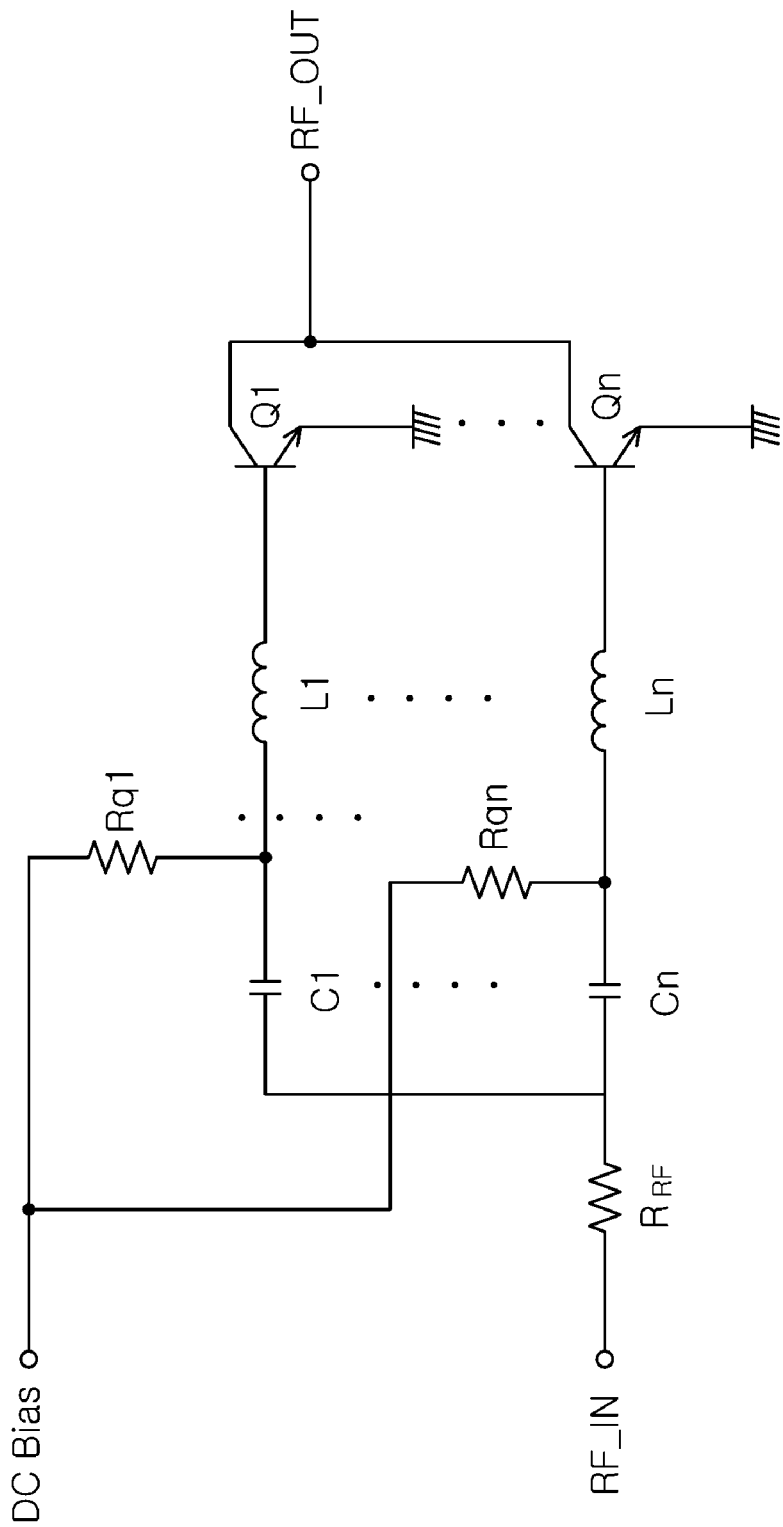
FIG. 4 is a view showing an amplifier circuit according to another embodiment of the present invention.

FIG. 4 is a view showing an amplifier circuit according to another embodiment of the present invention.

Referring to FIG. 4, an amplifier circuit 400 according to the present embodiment may include a plurality of transistors Q1 to Qn, a plurality of resistors Rq1 to Rqn, as well as inductive elements L1 to Ln and capacitive elements C1 to Cn connected in series, similar to the amplifier circuit 300 shown in FIG. 3. The inductive elements L1 to Ln and the capacitive elements C1 to Cn may be connected to a path along which an RF input signal is transmitted, the plurality of resistors Rq1 to Rqn may be connected to a path along which a DC bias signal is transmitted. Further, a resistor $R_{RF}$, suppressing an increase in non-linearity appearing when an excessively large RF input signal is applied, may be additionally connected to the path along which the RF input signal is transmitted.

Similar to the amplifier circuit 200 shown in FIG. 2, in the amplifier circuit 400 shown in FIG. 4, the plurality of resistors Rq1 to Rqn disposed on the path along which the DC bias signal is transmitted may have first and second nodes, wherein the first node is connected to a DC bias signal input terminal (DC bias) and the second node is connected to base terminals of the transistors Q1 to Qn through the inductive elements L1 to Ln. Therefore, the plurality of resistors Rq1 to Rqn and the inductive elements L1 to Ln are disposed on the path along which the DC bias signal is transmitted, such that a high frequency signal introduced together with the DC bias signal may be blocked.

In describing the amplifier circuits 100, 200, 300, and 400 according to the embodiments of the present invention with reference to FIGS. 1 through 4, it has been assumed that the transistors Q1 to Qn operating as the amplifier elements are BJTs for convenience of explanation. However, as described above, the transistors Q1 to Qn operating as the amplifier elements may be FETs rather than the BJTs. In this case, base, collector, and emitter terminals of the BJT may be replaced by gate, drain, and source terminals of the FET, respectively. That is, in the case of configuring the amplifier circuits 100, 200, 300, 400 using the FET, a DC bias signal and an RF input signal may be applied to the gate terminal of the FET, the source terminal of the FET may be connected to the ground terminal, and the drain terminal of the FET may be connected to the signal output terminal RF_OUT.

In addition, all of the amplifier circuits 100, 200, 300, and 400 shown in FIGS. 1 to 4 may include the inductive element L1 to Ln and the capacitive elements C1 to Cn connected in series to the path along which the RF input signal is transmitted. In particular, the inductive elements L1 to Ln are connected to the path along which the RF input signal is transmitted, whereby a high frequency may be attenuated and oscillations may be suppressed. This effect may be accomplished from a series resonance phenomenon between the inductive elements L1 to Ln and the capacitive elements C1 to Cn, and it may contribute to increasing system stability.

As set forth above, in an amplifier circuit including at least one transistor according to embodiments of the present invention, a resistor is disposed on a path along which a DC bias signal applied to a base (gate) terminal of the transistor is transmitted, thereby preventing thermal runaway that may occur during an amplifying operation of the transistor, and capacitive and inductive elements connected in series are disposed on a path along which an input signal to be amplified is transmitted, thereby removing harmonic components and suppressing oscillations.

While the present invention has been shown and described in connection with the embodiments, it will be apparent to those skilled in the art that modifications and variations can be made without departing from the spirit and scope of the invention as defined by the appended claims.

What is claimed is:

1. An amplifier circuit, comprising:
an amplifying unit including at least one transistor;
at least one first bias circuit unit including at least one resistor and connected to the at least one transistor; and
at least one second bias circuit unit connected between an input terminal to which an input signal is applied and the at least one transistor so as to block an input signal having a frequency higher than a first frequency or having a frequency lower than a second frequency, wherein:
the at least one transistor and the at least one resistor compose a negative feedback circuit preventing a thermal runaway of the at least one transistor,
the at least one second bias circuit unit includes a capacitive element and an inductive element connected in series, and
the resistor included in the at least one first bias circuit unit is connected to a node that is connected between the inductive element and the capacitive element included in the at least one second bias circuit unit.

2. The amplifier circuit of claim 1, wherein the at least one first bias circuit unit and the at least one second bias circuit unit are connected to a base or gate terminal of the at least one transistor.

3. The amplifier circuit of claim 1, wherein the at least one resistor included in the at least one first bias circuit unit is connected between the inductive element included in the at least one second bias circuit unit and a base or gate terminal of the at least one transistor.

4. The amplifier circuit of claim 1, further comprising a resistor connected between the input terminal and the at least one second bias circuit unit.

5. The amplifier circuit of claim 1, wherein the at least one transistor has a collector terminal connected to an output terminal outputting an output signal.

6. The amplifier circuit of claim 1, wherein the first frequency is higher han the second frequency.

7. The amplifier circuit of claim 1, wherein the inductive element of the at least one second bias circuit unit is configured to block an input signal that is inputted through the first bias circuit unit and has a frequency higher than the first frequency.

8. An amplifier circuit, comprising:
a plurality of transistors;
a plurality of resistors, each disposed on a path along which a bias signal inputted through a direct current (DC) bias signal input terminal is transmitted to a base or gate terminal of a corresponding one of the plurality of transistors; and
a plurality of inductive elements and a plurality of capacitive elements each connected between the base or gate terminal of a corresponding one of the plurality of transistors and a radio frequency (RF) signal input terminal, wherein:
the plurality of inductive elements and the plurality of the capacitive elements are respectively connected in series,
each of the plurality of resistors and the transistor corresponding thereto compose a negative feedback circuit preventing a thermal runaway of each of the plurality of resistors, and
each of the plurality of resistors is connected between the DC bias signal input terminal and a respective node that is connected between the plurality of inductive elements and the plurality of capacitive elements connected in series.

9. The amplifier circuit of claim 8, wherein each of the plurality of transistors has a collector or drain terminal connected to an RF signal output terminal.

10. The amplifier circuit of claim 8, wherein each of the plurality of resistors is connected between the DC bias signal input terminal and the base or gate terminal of each of the plurality of transistors.

11. The amplifier circuit of claim 8, wherein the each of the plurality of inductive elements is configured to block the bias signal inputted through the DC bias signal input terminal when the bias signal has a frequency higher than a predetermined frequency.

12. A method of operating an amplifier circuit, the method comprising:
receiving a first signal through a first bias circuit unit including at least one resistor;
receiving a second signal through a second bias circuit unit blocking a signal having a frequency higher than a first frequency or having a frequency lower than a second frequency; and
operating the amplifier circuit including at least one transistor by the first signal to amplify the second signal, wherein:
the at least one transistor and the at least one resistor compose a negative feedback circuit preventing a thermal runaway of the at least one transistor,
the receiving of the second signal is performed through the second bias circuit unit including a capacitive element and an inductive element connected in series, and
the at least one resistor is connected between a DC bias signal input terminal and a node that is connected between the inductive element and the capacitive element connected in series.

13. The method of claim 12, wherein the receiving of the second signal comprises receiving an RF signal transmitted through the second bias circuit unit as the second signal.

14. The method of claim 12, wherein the first signal and the second signal are received through a base or gate terminal of a transistor operating as an amplifier.

15. The method of claim 12, wherein the first frequency is higher than the second frequency.

16. The method of claim 12, wherein the inductive element of the second bias circuit unit is configured to block the first signal when the first signal has a frequency higher than the first frequency.

* * * * *